(12) United States Patent
Han et al.

(10) Patent No.: US 11,482,667 B2
(45) Date of Patent: Oct. 25, 2022

(54) NONVOLATILE MEMORY DEVICE HAVING A RESISTANCE CHANGE LAYER AND A PLURALITY OF ELECTRODE PATTERN LAYERS

(71) Applicant: SK hynix Inc., Icheon-si (KR)

(72) Inventors: Jae Hyun Han, Icheon-si (KR); Hyangkeun Yoo, Seongnam-si (KR); Se Ho Lee, Yongin-si (KR)

(73) Assignee: SK hynix Inc.

( * ) Notice: Subject to any disclaimer, the term of this patent is extended or adjusted under 35 U.S.C. 154(b) by 47 days.

(21) Appl. No.: 16/904,825

(22) Filed: Jun. 18, 2020

(65) Prior Publication Data

US 2021/0202835 A1    Jul. 1, 2021

(30) Foreign Application Priority Data

Dec. 31, 2019    (KR) .................. 10-2019-0179517

(51) Int. Cl.
*H01L 45/00* (2006.01)

(52) U.S. Cl.
CPC .......... *H01L 45/1206* (2013.01); *H01L 45/08* (2013.01); *H01L 45/085* (2013.01); *H01L 45/1226* (2013.01); *H01L 45/142* (2013.01); *H01L 45/144* (2013.01); *H01L 45/147* (2013.01)

(58) Field of Classification Search
CPC ... H01L 45/1206; H01L 45/08; H01L 45/085; H01L 45/12; H01L 45/122; H01L 45/1226; H01L 45/1246; H01L 45/1273; G11C 11/5614; G11C 13/0011
See application file for complete search history.

(56) References Cited

U.S. PATENT DOCUMENTS

| | | | |
|---|---|---|---|
| 2009/0184305 A1* | 7/2009 | Lee | H01L 27/24 257/E47.001 |
| 2017/0148982 A1* | 5/2017 | Karpov | H01L 45/08 |
| 2017/0221559 A1* | 8/2017 | Chen | H01L 27/2481 |
| 2019/0305046 A1* | 10/2019 | Jha | G11C 11/54 |

FOREIGN PATENT DOCUMENTS

| KR | 101007032 B1 | 1/2011 |
|---|---|---|
| KR | 101792429 B1 | 11/2017 |

OTHER PUBLICATIONS

English machine translation of KR 101792429 B1 to Yoon et al. (Year: 2017).*

* cited by examiner

*Primary Examiner* — Steven B Gauthier
*Assistant Examiner* — Candice Chan

(57) ABSTRACT

A nonvolatile memory device according to an embodiment includes a substrate, a resistance change layer disposed over the substrate, a gate insulation layer disposed on the resistance change layer, a gate electrode layer disposed on the gate insulation layer, and a first electrode pattern layer and a second electrode pattern layer that are disposed respectively over the substrate and disposed to contact a different portion of the resistance change layer.

8 Claims, 17 Drawing Sheets

NONVOLATILE MEMORY DEVICE HAVING A RESISTANCE CHANGE LAYER AND A PLURALITY OF ELECTRODE PATTERN LAYERS

CROSS-REFERENCE TO RELATED APPLICATIONS

The present application claims priority under 35 U.S.C. § 119(a) to Korean Application No. 10-2019-0179517, filed on Dec. 31, 2019, which is incorporated herein by references in its entirety.

BACKGROUND

1. Technical Field

The present disclosure generally relates to a nonvolatile memory device and, more particularly, to a nonvolatile memory device having a resistance change layer and a method of operating the same.

2. Related Art

Due to trends in semiconductor devices that include decreasing design rules and increasing the degree of integration, research has continued on the structures of semiconductor devices that can guarantee both the structural stability and reliability of signal storage operations. Currently, a nonvolatile memory device such as a flash memory employing a three-layer stacked structure including a charge tunneling layer, a charge trap layer, and a charge barrier layer as a charge storage structure has been widely applied.

Recently, various nonvolatile memory devices having structures different from existing flash memory devices have been proposed. An example of a nonvolatile memory device is a resistance change memory device. While a flash memory device implements a memory function through charge storage, in a resistance change memory device, the resistance state of a memory layer in a memory cell is variably changed between a high resistance state and a low resistance state, and the changed resistance states are stored in a nonvolatile manner, thereby writing predetermined signal information in the memory cell.

SUMMARY

A nonvolatile memory device according to an aspect of the present disclosure includes a substrate, a resistance change layer disposed over the substrate, a gate insulation layer disposed on the resistance change layer, a gate electrode layer disposed on the gate insulation layer, and a first electrode pattern layer and a second electrode pattern layer that are disposed respectively over the substrate and disposed to contact a different portion of the resistance change layer.

A nonvolatile memory device according to another aspect of the present disclosure includes a substrate, a gate electrode layer disposed over the substrate, a gate insulation layer disposed over the substrate and disposed to surround the gate electrode layer, first and second electrode pattern layers disposed over the substrate and respectively disposed on opposite sides of the gate electrode layer, and a resistance change layer disposed on the gate insulation layer and on the first and second electrode pattern layers. The resistance change layer includes oxygen vacancies and movable metal ions.

A nonvolatile memory device according to yet another aspect of the present disclosure includes a substrate, a first electrode pattern layer and a second electrode pattern layer that are disposed on the substrate and disposed to be spaced apart from each other, a resistance change layer disposed over the first electrode pattern layer and the second electrode pattern layer, and a gate insulation layer and a gate electrode layer that are sequentially disposed on the resistance change layer. The resistance change layer includes oxygen vacancies and movable metal ions.

There is disclosed a method of operating a nonvolatile memory device according to yet another aspect of the present disclosure. In the method of operating a nonvolatile memory device, a nonvolatile memory device including a resistance change layer disposed over a substrate, a gate insulation and a gate electrode layer that are sequentially disposed on the resistance change layer, and first and second electrode pattern layers respectively disposed to contact a different portion of the resistance change layer over the substrate is provided. A first gate voltage is applied to the gate electrode layer to move oxygen vacancies or movable metal ions in the resistance change layer to a filament formation region of the resistance change layer. A set voltage is applied between the first and second electrode pattern layers to form a conductive filament in the resistance change layer, to electrically connect the first and second electrode pattern layers to each other.

DETAILED DESCRIPTION

Figure 1:
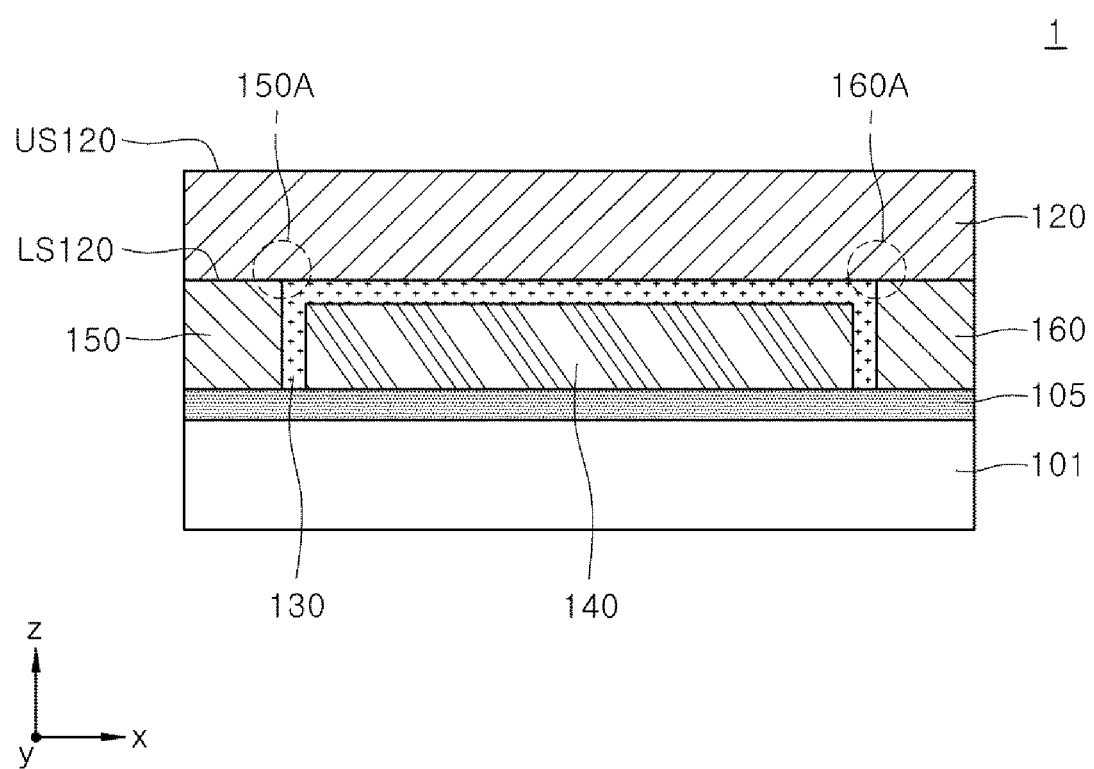
FIG. 1 is a cross-sectional view schematically illustrating a nonvolatile memory device according to an embodiment of the present disclosure.

Hereinafter, embodiments of the present disclosure will be described in detail with reference to the accompanying drawings. In the drawings, in order to clearly express the components of each device, the sizes of the components, such as width and thickness of the components, are enlarged. The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms "comprise", "include", or "have" are intended to specify the presence of a feature, a number, a step, an operation, a component, an element, a part, or combinations thereof, but not used to preclude the presence or possibility of addition one or more other features, numbers, steps, operations, components, elements, parts, or combinations thereof.

Further, in performing a method or a manufacturing method, each process constituting the method can take place differently from the stipulated order unless a specific sequence is described explicitly in the context. In other words, each process may be performed in the same manner as stated order, and may be performed substantially at the same time. Also, at least a part of each of the above processes may be performed in a reversed order.

In the specification, the term "a predetermined direction" may mean a direction encompassing one direction determined in a coordinate system and a direction opposite to that direction. As an example, in the x-y-z coordinate system, the z-direction may encompass a direction parallel to the z-direction. That is, the z-direction may mean all of a direction in which an absolute value of the z-axis increases in a positive direction along the z-axis from the origin 0 and a direction in which an absolute value of the z-axis increases in a negative direction along the z-axis from the origin 0. The x-direction and the y-direction may each be interpreted in substantially the same way in the x-y-z coordinate system.

FIG. 1 is a cross-sectional view schematically illustrating a nonvolatile memory device according to an embodiment of the present disclosure. Referring to FIG. 1, a nonvolatile memory device 1 may include a substrate 101, a resistance change layer 120 disposed over the substrate 101, a gate insulation layer 130 disposed on the resistance change layer 120, a gate electrode layer 140 disposed on the gate insulation layer 130, and a first electrode pattern layer 150 and a second electrode pattern layer 160 disposed to respectively contact a different portion of the resistance change layer 120 over the substrate 101. The gate insulation layer 130 may surround the gate electrode layer 140 and may isolate the gate electrode layer 140 from the resistance change layer 120, the first electrode pattern layer 150 and the second electrode pattern layer 160. In addition, the nonvolatile memory device 1 may further include a device insulation layer 105 on the substrate 101. The device insulation layer 105 may be disposed to isolate the gate insulation layer 130, the gate electrode layer 140, the first electrode pattern layer 150, and the second electrode pattern layer 160 from the substrate 101.

Referring to FIG. 1, the substrate 101 provided may include a semiconductor material. Specifically, the semiconductor material may include, for example, silicon (Si), germanium (Ge), gallium arsenide (GaAs), and the like. The substrate 101 may be doped with an n-type dopant or a p-type dopant. As an example, the substrate 101 may include a well region doped with an n-type dopant or a p-type dopant.

The device insulation layer 105 may be disposed on the substrate 101. The device insulation layer 105 may insulate the gate insulation layer 130, the gate electrode layer 140, the first electrode pattern layer 150, and the second electrode pattern layer 160 from the substrate 101. The device insulation layer 105 may, for example, include oxide, nitride, oxynitride, or a combination of two or more thereof.

Although not illustrated in FIG. 1, at least one conductive layer and at least one insulation layer may be disposed between the substrate 101 and the device insulation layer 105. The conductive layer and the insulation layer may form various circuit patterns. That is, the conductive layer and the insulation layer may form a plurality of wirings or may constitute passive elements such as capacitors or resistors, or active elements such as diodes or transistors, as non-limiting examples.

Referring again to FIG. 1, the gate electrode layer 140 may be disposed on the device insulation layer 105. The gate electrode layer 140 may be a pattern of a conductive thin film. The gate electrode layer 140 may include a conductive material. The conductive material may, for example, include a doped semiconductor material, metal, conductive metal nitride, conductive metal carbide, conductive metal silicide, or conductive metal oxide. The conductive material may, for example, include n-type doped silicon (Si), tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

The gate insulation layer 130 may be disposed on the gate electrode layer 140. In an embodiment, the gate insulation layer 130 may be disposed to surround the gate electrode layer 140. The gate insulation layer 130 may contact the first and second electrode pattern layers 150 and 160 in a lateral direction, such as in an x-axis direction. The gate insulation layer 130 can electrically insulate the first and second electrode pattern layers 150 and 160 from the gate electrode layer 140. In addition, the gate insulation layer 130 can prevent oxygen vacancies or movable metal ions inside the resistance change layer 120 from moving to the gate electrode layer 140. The gate insulation layer may, for example, include silicon oxide, silicon nitride, silicon oxynitride, aluminum oxide, hafnium oxide, and the like.

Referring to FIG. 1, the first and second electrode pattern layers 150 and 160 may be disposed on the opposite sides of each other on the basis of the gate electrode layer 140 on the device insulation layer 105. The first and second electrode pattern layers 150 and 160 may each contact the gate insulation layer 130 in a lateral direction. The first and second electrode pattern layers 150 and 160 may be electrically insulated from the gate electrode layer 140 by the gate insulation layer 130. The top surfaces of the first and second electrode pattern layers 150 and 160 may be positioned at the same level as the top surface of the gate insulation layer 130.

The first and second electrode pattern layers 150 and 160 may each include a conductive material. The conductive material may, for example, include a doped semiconductor material, metal, conductive metal nitride, conductive metal carbide, conductive metal silicide, or conductive metal oxide. The conductive material may, for example, include n-type doped silicon (Si), tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

The resistance change layer 120 may be disposed on the first and second electrode pattern layers 150 and 160 and on the gate insulation layer 130. The resistance change layer 120 may have a first surface LS120 and a second surface US120 opposite to the first surface LS120. As illustrated, the resistance change layer 120 may contact the first and second electrode pattern layers 150 and 160 and the gate insulation layer 130 at the first surface LS120.

The resistance change layer 120 may include a variable resistance material. In the variable resistance material, an internal resistance state may be variably changed according to the polarity or magnitude of an applied voltage. In addition, the changed internal resistance state may be stored, in a nonvolatile manner, in the variable resistance material after the applied voltage is removed. As an example, a high resistance state and a low resistance state, which are distinguished from each other, may be selectively stored in the variable resistance material. In other words, the variable resistance material may have a predetermined first resistance value corresponding to the high resistance state and may have a predetermined second resistance value corresponding to the low resistance state. The first resistance value and the second resistance value of a resistance change layer may be determined depending on the kind of the variable resistance material.

In an embodiment, the variable resistance material may include oxygen vacancies or movable metal ions. The oxygen vacancies may have a positive charge. The metal ion may be a cation having a positive charge, or an anion having a negative charge.

In an embodiment, the variable resistance material may, for example, include titanium oxide, aluminum oxide, nickel oxide, copper oxide, zirconium oxide, manganese oxide, hafnium oxide, tungsten oxide, tantalum oxide, niobium oxide, iron oxide, or a combination of two or more thereof. In other embodiments, the variable resistance material may include PCMO ($Pr_{1-x}Ca_xMnO_3$, $0<x<1$), LCMO ($La_{1-x}Ca_xMnO_3$, $0<x<1$), BSCFO ($Ba_{0.5}Sr_{0.5}Co_{0.8}Fe_{0.2}O_{3-\delta}$), YBCO ($YB_{a2}Cu_3O_{7-x}$, $0<x<1$), (Ba, Sr)$TiO_3$ doped with chromium (Cr) or niobium (Nb), $SrZrO_3$ doped with chromium (Cr) or vanadium (V), (La, Sr) $MnO_3$, $Sr_{1-x}La_xTiO_3$ ($0<x<1$), $La_{1-x}Sr_xFeO_3$ ($0<x<1$), $La_{1-x}Sr_xCoO_3$ ($0<x<1$), $SrFeO_{2.7}$, $LaCoO_3$, $RuSr_2GdCu_2O_3$, $YB_{a2}Cu_3O_7$, or a combination of two or more thereof. As another example, the variable resistance material may include germanium-antimony-tellurium (GST), arsenic-antimony-tellurium (As—Sb—Te), tin-antimony-tellurium (Sn—Sb—Te), tin-indium-antimony-tellurium (Sn—In—Sb—Te), arsenic-germanium-antimony-tellurium (As—Ge—Sb—Te), $GexSe_{1-x}$ ($0<x<1$), silver sulfide ($Ag_2S$), copper sulfide ($Cu_2S$), Cadmium sulfide (CdS), zinc sulfide (ZnS), and selenium oxide ($CeO_2$), or a combination of two or more thereof.

Referring to FIG. 1, the first electrode pattern layer 150 may have a pattern edge portion 150A positioned in a boundary region contacting the resistance change layer 120 and the gate insulation layer 130. Similarly, the second electrode pattern layer 160 may have a pattern edge portion 160A in a boundary region contacting the resistance change layer 120 and the gate insulation layer 130. Although not specifically illustrated in FIG. 1, the pattern edge portions 150A and 160A may extend along the y-direction. When a voltage is applied between the first electrode pattern layer 150 and the second electrode pattern layer 160, an electric field resulting from the applied voltage may be concentrated on the pattern edge portions 150A and 160A.

Figure 2:
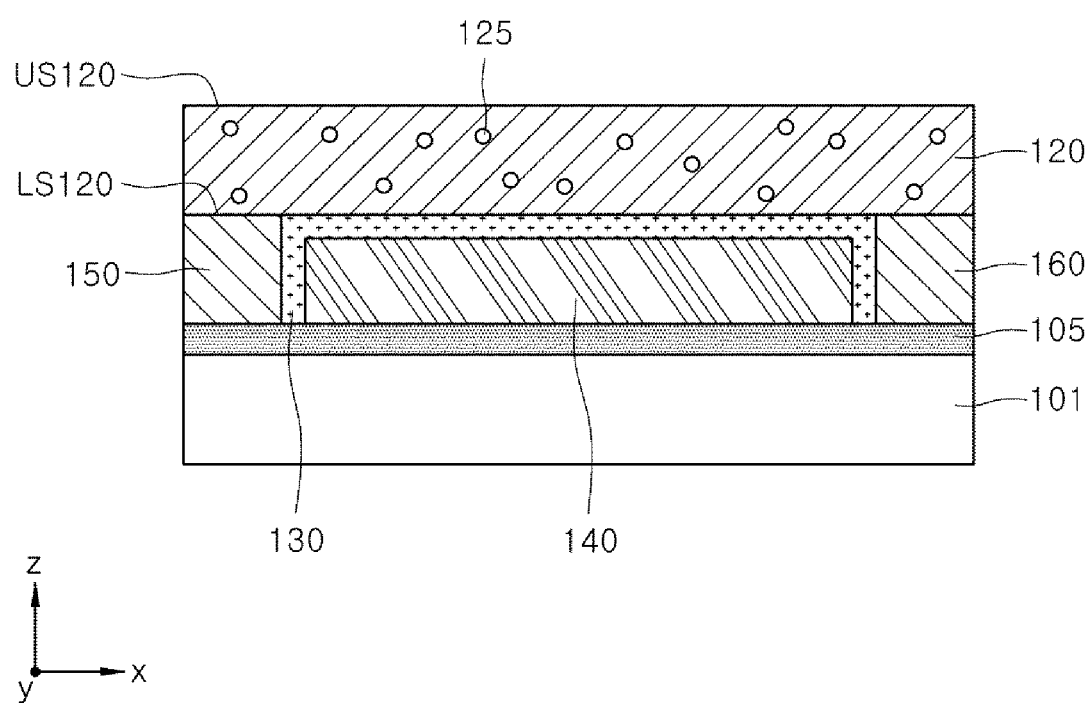
FIGS. 2 to 4 are views explaining a set operation of a nonvolatile memory device according to an embodiment of the present disclosure.
Figure 3:
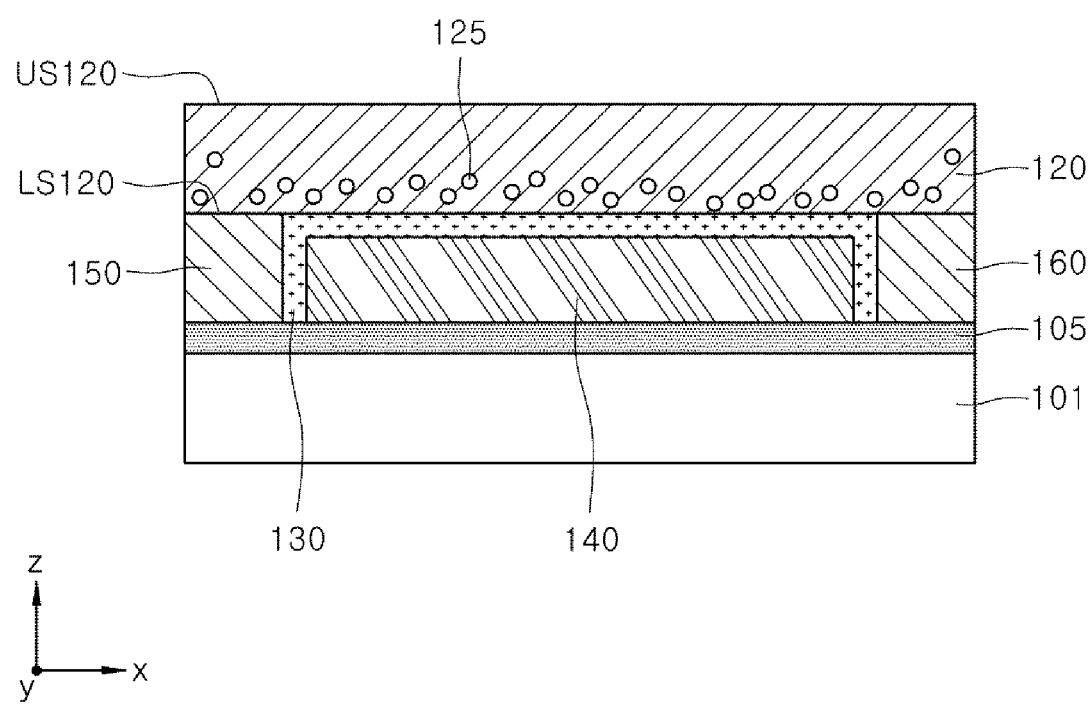
Figure 4:
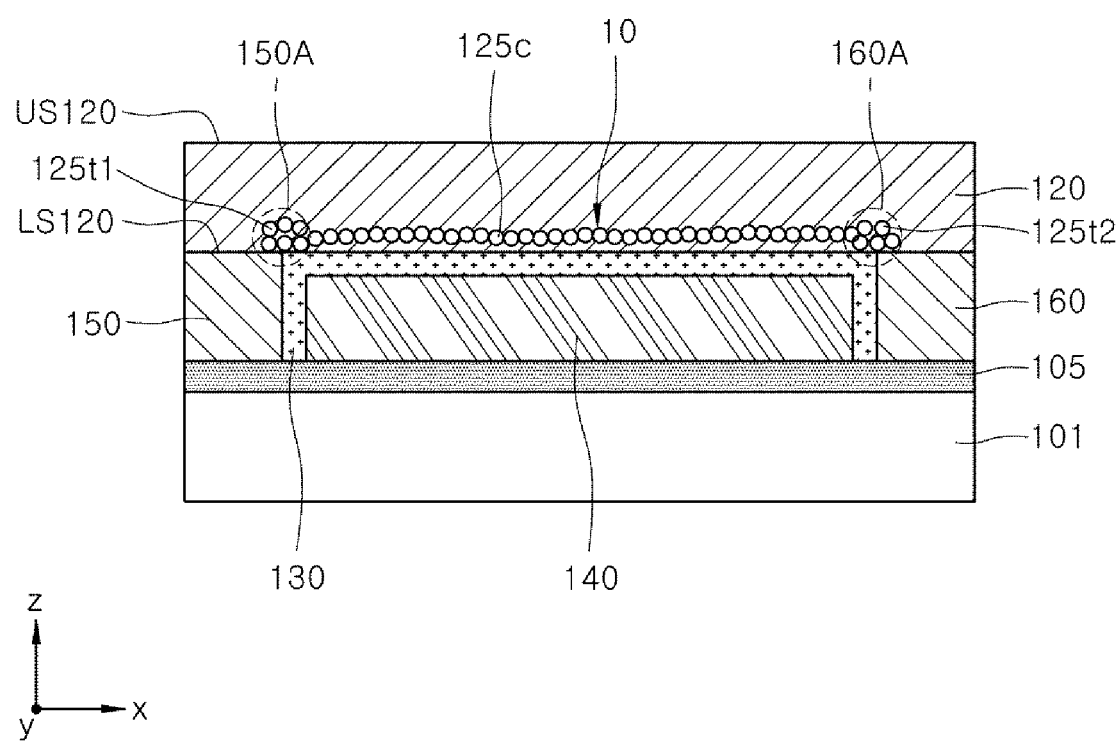
Figure 5:
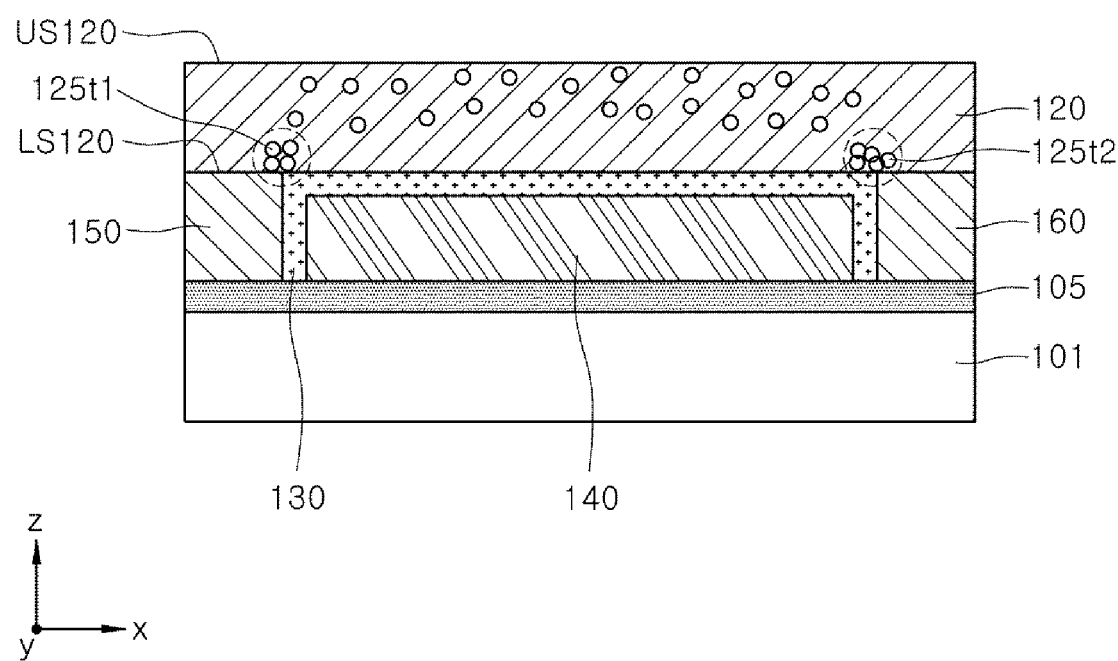
FIG. 5 is a view explaining a reset operation of a nonvolatile memory device according to an embodiment of the present disclosure.

Hereinafter, a method of operating a nonvolatile memory device 1 will be described with reference to FIGS. 2 to 5. FIGS. 2 to 4 are views explaining a set operation of the nonvolatile memory device 1 according to an embodiment of the present disclosure. When the resistance change layer of the nonvolatile memory device 1 has a high resistance state, the set operation may be an operation of changing the resistance state of the resistance change layer to a low resistance state. FIG. 5 is a view explaining a reset operation of a nonvolatile memory device 1 according to an embodiment of the present disclosure. The reset operation may be an operation of converting the resistance state of the resistance change layer from a low resistance state into a high resistance state.

Referring to FIG. 2, the nonvolatile memory device 1 described above with reference to FIG. 1 may be provided. The resistance change layer 120 may include oxygen vacancies or movable metal ions 125. In an embodiment, the oxygen vacancies or movable metal ions 125 may be uniformly distributed inside the resistance change layer 120. In an example, the resistance change layer 120 is provided with oxygen vacancies 125 having a positive charge. As another embodiment, substantially the same operation method may be applied when the resistance change layer 120 includes movable metal ions 125.

Referring to FIG. 3, a first gate voltage may be applied to the gate electrode layer 140. The first gate voltage may include a bias having a negative polarity. Under the influence of the first gate voltage, the oxygen vacancies 125 inside the resistance change layer 120 may move to a filament formation region adjacent to the first surface LS120. The filament formation region is a region for generating a conductive filament 10, which will be described later, and may refer to an inner region of the resistance change layer 120 adjacent to the gate insulation layer 130 and to the first and second electrode pattern layers 150 and 160.

According to an embodiment, the concentration or magnitude of the oxygen vacancies 125 moving to the filament formation region may be controlled by controlling the magnitude of the first gate voltage. The concentration of the oxygen vacancies 125 may determine the diameter of the conductive filament formed in an operation described below.

Referring to FIG. 4, while the first gate voltage is applied to the gate electrode layer 140, a set voltage may be applied between the first electrode pattern layer 150 and the second electrode pattern layer 160. As a result, an electric field resulting from the set voltage may be formed inside the resistance change layer 120, and a conductive filament 10 electrically connecting the first electrode pattern layer 150 and the second electrode pattern layer 160 may be formed in the resistance change layer 120.

In the structure of the nonvolatile memory device 1 of the embodiment, when the set voltage is applied, the electric field may be concentrated on the pattern edge portions 150A and 160A of the first and second electrode pattern layers 150 and 160. Accordingly, the oxygen vacancies 125 in the region of the resistance change layer 120 adjacent to the pattern edge portions 150A and 160A may be more actively aggregated or bonded to each other, so that first and second trigger filaments 125t1 and 125t2 may be formed as illustrated in FIG. 4. The first and second trigger filaments 125t1 and 125t2 may be formed to contact the first and second electrode pattern layers 150 and 160, respectively.

In addition, the oxygen vacancies 125 may continuously aggregate or bond to the first and second trigger filaments 125t1 and 125t2, so that a connecting filament 125c may grow. The connecting filament 125c connects the first and second trigger filaments 125t1 and 125t2, so that the conductive filament 10 can be completed as a continuous and connected filament. The conductive filament 10, which electrically connects the first electrode pattern layer 150 and the second electrode pattern layer 160, reduces the electrical resistance of the resistance change layer 120. Even after the set voltage and the gate voltage are removed, the conductive filament 10 remains inside the resistance change layer 120, so that the resistance change layer 120 can be written and maintained in a low resistance state.

In an embodiment, the first and second trigger filaments 125t1 and 125t2, formed in the pattern edge portions 150A and 160A, on which the electric field is concentrated may have a higher concentration of oxygen vacancies 125 than the connecting filament 125c. Accordingly, the diameter of each of the first and second trigger filaments 125t1 and 125t2 may be larger than the diameter of the connecting filament 125c.

In some embodiments, the concentration of the oxygen vacancies 125 induced into the filament formation region by the first gate voltage may determine the diameter of the conductive filament 10. As the concentration of the induced oxygen vacancies 125 is increased, the number of oxygen vacancies 125 that aggregate or bond as a result of the applied set voltage may be increased. Accordingly, the diameter of the conductive filament 10 formed by the set voltage can be increased. In addition, as the diameter of the conductive filament 10 is increased, the resistance value of the resistance change layer 120 can be decreased. As described above, a plurality of resistance values can be written in the resistance change layer 120 by using a characteristic in which the resistance value of the resistance change layer 120 changes depending on the width of the conductive filament 10. As a result, a nonvolatile memory device that stores a plurality of pieces of signal information in the resistance change layer 120 can be implemented using a structure that can form conductive filaments with variable diameters.

Meanwhile, a reset operation according to another embodiment of the present disclosure will be described with reference to FIG. 5. A second gate voltage may be applied to the gate electrode layer 140. The second gate voltage may include a bias having a positive polarity. Further, while applying the second gate voltage, a reset voltage may be applied between the first electrode pattern layer 150 and the second electrode pattern layer 160. The reset voltage may have a different polarity from the set voltage.

According to an embodiment, the oxygen vacancies 125 of the conductive filament 10 in resistance change layer 120 may be decomposed by the reset voltage. In some embodiments, the reset voltage may generate the Joule heat in the conductive filament 10 and the Joule heat may decompose the oxygen vacancies 125 from the conductive filament 10. In addition, the oxygen vacancies 125 available from the decomposition may be expelled from the filament formation region by the bias, having a positive polarity, of the second gate voltage. That is, the decomposed oxygen vacancies 125 may move away from the region of the resistance change layer 120 adjacent to the first surface LS120 and towards a region of the resistance change layer 120 adjacent to the second surface US120.

In an embodiment, the decomposition of the conductive filament 10 generated by the reset voltage may occur more actively in the connecting filament 125c, having a relatively low concentration of the aggregated or bound oxygen vacancies 125. Accordingly, the first and second trigger filaments 125t1 and 125t2, which have relatively high concentrations of the aggregated or bound oxygen vacancies 125, may remain in the pattern edge portions 150A and 160A of the first and second electrode pattern layers 150 and 160 for a longer duration as compared to the bound oxygen vacancies 125 of the connecting filament 125c.

As described above, as at least a portion of the conductive filament 10 is degraded, the electrical resistance of the resistance change layer 120 may be increased. Accordingly, the internal resistance state of the resistance change layer 120 may be converted from a low resistance state to a high resistance state when the conductive filament is disconnected. The degree of disconnection of the conductive filament 10 is maintained even after the second gate voltage and the reset voltage are removed, so that the resistance change layer 120 can retain the high resistance state.

According to the above-described embodiments of the present disclosure, when a set operation is performed on the nonvolatile memory device 1, the first and second trigger filaments 125t1 and 125t2 may be formed in the resistance change layer 120 adjacent to the pattern edge portions 150A and 160A, which are electric field concentration portions. Then, the connecting filament 125c is formed to connect the first and second trigger filaments 125t1 and 125t2, so that a complete and connected conductive filament 10 can be formed. As a result, the density and distribution of the conductive filaments 10 can be effectively limited by controlling the locations of the first and second trigger filaments 125t1 and 125t2. In addition, it is possible to prevent a set operation error and a reset operation error of the nonvolatile memory device 1 from occurring by stably forming the first and second trigger filaments 125t1 and 125t2 in the pattern edge portions 150A and 160A. That is, the connection or disconnection state of the conductive filament 10 is structurally stabilized using the trigger filaments, so that retention and endurance of signal information can be improved.

In other embodiments, the conductive filament 10 of the nonvolatile memory device 1 may be formed with movable metal ions 125 distributed inside the resistance change layer 120. As an embodiment, when the resistance change layer 120 includes positive metal ions 125, the phenomenon in which the conductive filament is generated or disconnected in the resistance change layer 120 may be caused respectively by the same operation as the set operation described above with reference to FIGS. 2 to 4 and the reset operation described above with reference to FIG. 5.

In another embodiment, when the resistance change layer 120 includes negative metal ions 125, a first gate voltage including a bias having a positive polarity may be applied to the gate electrode layer 140. Accordingly, the negative metal ions 125 may move to the filament formation region of the resistance change layer 120 adjacent to the first surface LS120. Subsequently, while applying the first gate voltage, a set voltage may be applied between the first and second electrode pattern layers 150 and 160 to form a conductive filament in the resistance change layer 120. The set voltage in this embodiment may have a different polarity from the set voltage in the embodiment described above in connection with FIG. 4. Meanwhile, when performing the reset process, a second gate voltage including a bias having a negative polarity may be applied to the gate electrode layer 140. Also, while applying the second gate voltage, a reset voltage may be applied between the first and second electrode pattern layers 150 and 160. Thus, here the reset voltage of the embodiment may have a different polarity from the reset voltage of the embodiment described above with reference to FIG. 5. Accordingly, the negative metal ions 125 decomposed from the conductive filament by the reset voltage can be effectively expelled and moved away from the filament formation region.

Figure 6:
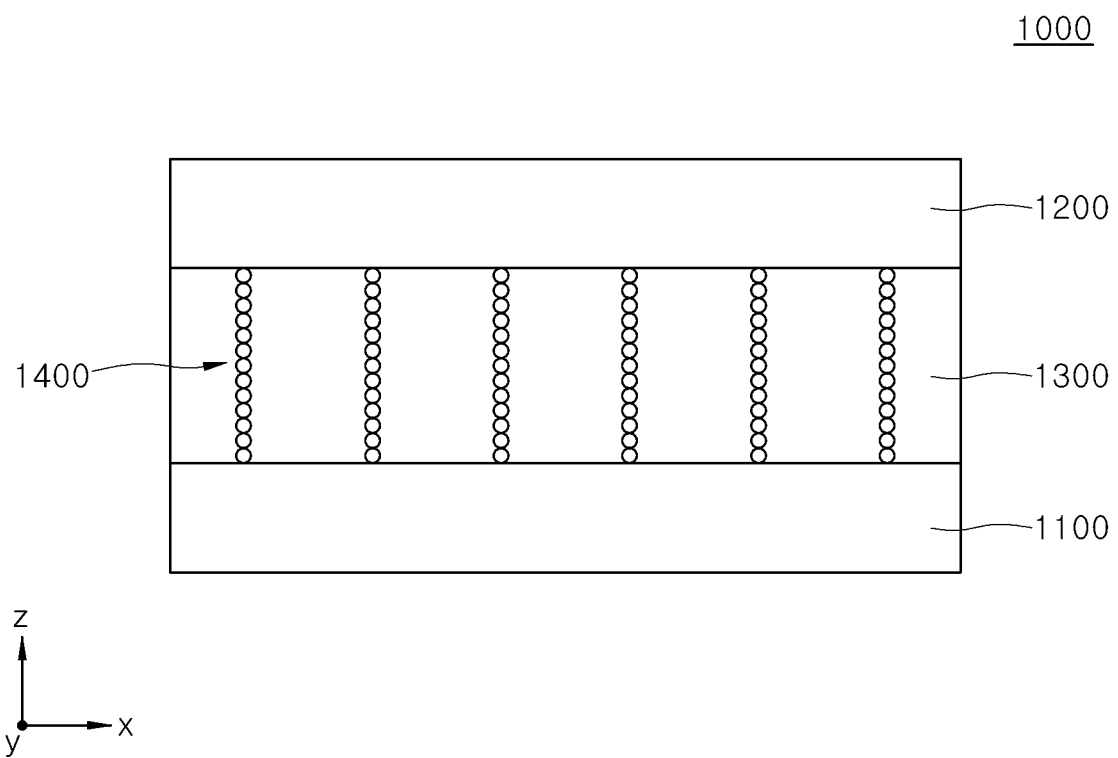
FIG. 6 is a cross-sectional view of a nonvolatile memory device according to a comparative example.

FIG. 6 is a cross-sectional view schematically illustrating a nonvolatile memory device according to a comparative example. Referring to FIG. 6, a nonvolatile memory device 1000 may include first and second electrode layers 1100 and 1200 that face each other along the z-direction. Also, the nonvolatile memory device 1000 may include a resistance change layer 1300 disposed between the first and second electrode layers 1100 and 1200. Because the first electrode layer 1100 and the second electrode layer 1200 are disposed to face each other along the z-direction, when a set voltage is applied, a plurality of conductive filaments 1400 may be grown randomly between interfaces of the resistance change layer 1300 with the first and second electrode layers 1100 and 1200. That is, in the case of the comparative example, it may be relatively difficult to control the density and distribution of the conductive filament 1400. In contrast, in the embodiment of the present disclosure, as illustrated in FIG. 4, the first and second electrode pattern layers 150 and 160 do not face each other with a resistance change layer in between. In addition, in the embodiment of the present disclosure, the first and second trigger filaments 125*t*1 and 125*t*2 formed in the pattern edge portions 150A and 160A may determine the starting position of the conductive filament 10. Accordingly, the density and distribution of the conductive filament 10 can be effectively controlled.

Figure 7:
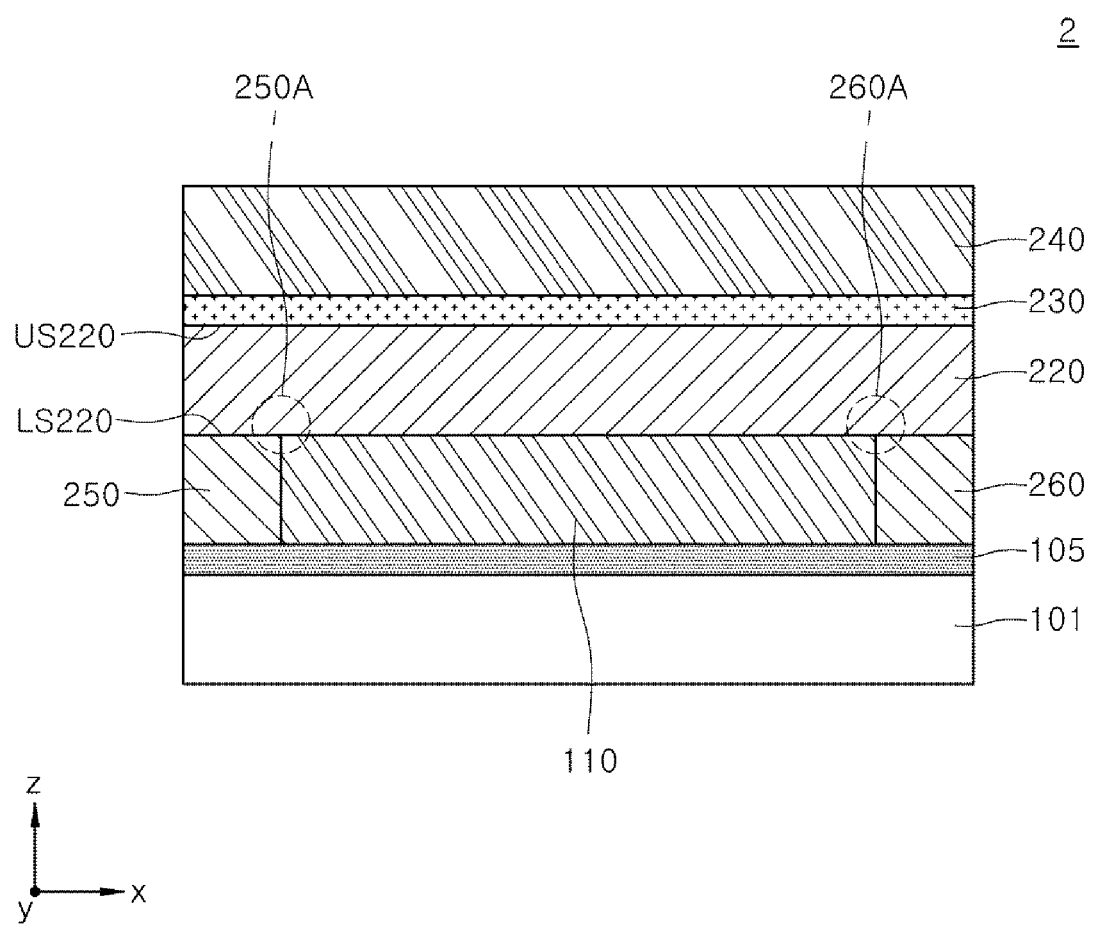
FIG. 7 is a cross-sectional view schematically illustrating a nonvolatile memory device according to another embodiment of the present disclosure.

FIG. 7 is a cross-sectional view schematically illustrating a nonvolatile memory device according to another embodiment of the present disclosure. Referring to FIG. 7, the nonvolatile memory device 2 may include a substrate 101, a resistance change layer 220 disposed over the substrate 101, a gate insulation layer 230 disposed on the resistance change layer 220, a gate electrode layer 240 disposed on the gate insulation layer 230, and a first electrode pattern layer 250 and a second electrode pattern layer 260 that are disposed over the substrate 101 to contact different portions of the resistance change layer 220. In addition, the nonvolatile memory device 2 may further include a device insulation layer 105 that electrically insulates the first and second electrode pattern layers 250 and 260 from the substrate 101. In addition, the nonvolatile memory device 2 may further include an interlayer insulation layer 110 disposed between the first electrode pattern layer 250 and the second electrode pattern layer 260 on the device insulation layer 105.

The device insulation layer 105 may be disposed on the substrate 101. The first electrode pattern layer 250 and the second electrode pattern layer 260 may be disposed on the device insulation layer 105 to be spaced apart from each other in the x-direction. The first electrode pattern layer 250 and the second electrode pattern layer 260 may have edge portions 250A and 260A, respectively. The configurations of the first and second electrode pattern layers 250 and 260 and the edge portions 250A and 250B may be substantially the same as the configurations of the first and second electrode pattern layers 150 and 160 and the pattern edge portions 150A and 160A described above with reference to FIGS. 1-5.

The interlayer insulation layer 110 may be disposed in the lateral direction from the first and second electrode pattern layers 250 and 260. The interlayer insulation layer 110 may electrically insulate the first and second electrode pattern layers 250 and 260. The interlayer insulation layer 110 may include an insulative material. The insulative material may, for example, be oxide, nitride, or oxynitride. In an embodiment, the upper surfaces of the interlayer insulation layer 110 and of the first and second electrode pattern layers 250 and 260 may be positioned on the same level on the z-axis.

The resistance change layer 220 may be disposed on the first and second electrode pattern layers 250 and 260 and on the interlayer insulation layer 110. The resistance change layer 220 may include a first surface LS220 and a second surface US220 opposite to the first surface LS220. The first surface LS220 of the resistance change layer 220 may contact the first and second electrode pattern layers 250 and 260 and the interlayer insulation layer 110. The configuration of the resistance change layer 220 may be substantially the same as the configuration of the resistance change layer 120 of the nonvolatile memory device 1 described above with reference to FIG. 1.

The gate insulation layer 230 may be disposed on the second surface US220 of the resistance change layer 220. The gate insulation layer 230 may be disposed to contact the second surface US220. Other than in terms of structural configuration, the gate insulation layer 230 may be the same as that of the gate insulation layer 130 of the nonvolatile memory device 1 described above with reference to FIG. 1. For example, the gate insulation layer 230 may have the same material as the gate insulation layer 130. In addition, the gate insulation layer 230 may have the same function as the gate insulation layer 130

The gate electrode layer 240 may be disposed on the gate insulation layer 230. Other than in terms of structural configuration, the gate electrode layer 240 may be substantially the same as that of the gate electrode layer 140 of the nonvolatile memory device 1 described above with reference to FIG. 1. For example, the gate electrode layer 240 may have the same material as the gate electrode layer 140. In addition, the gate electrode layer 240 may have the same function as the gate electrode layer 140.

Figure 8:
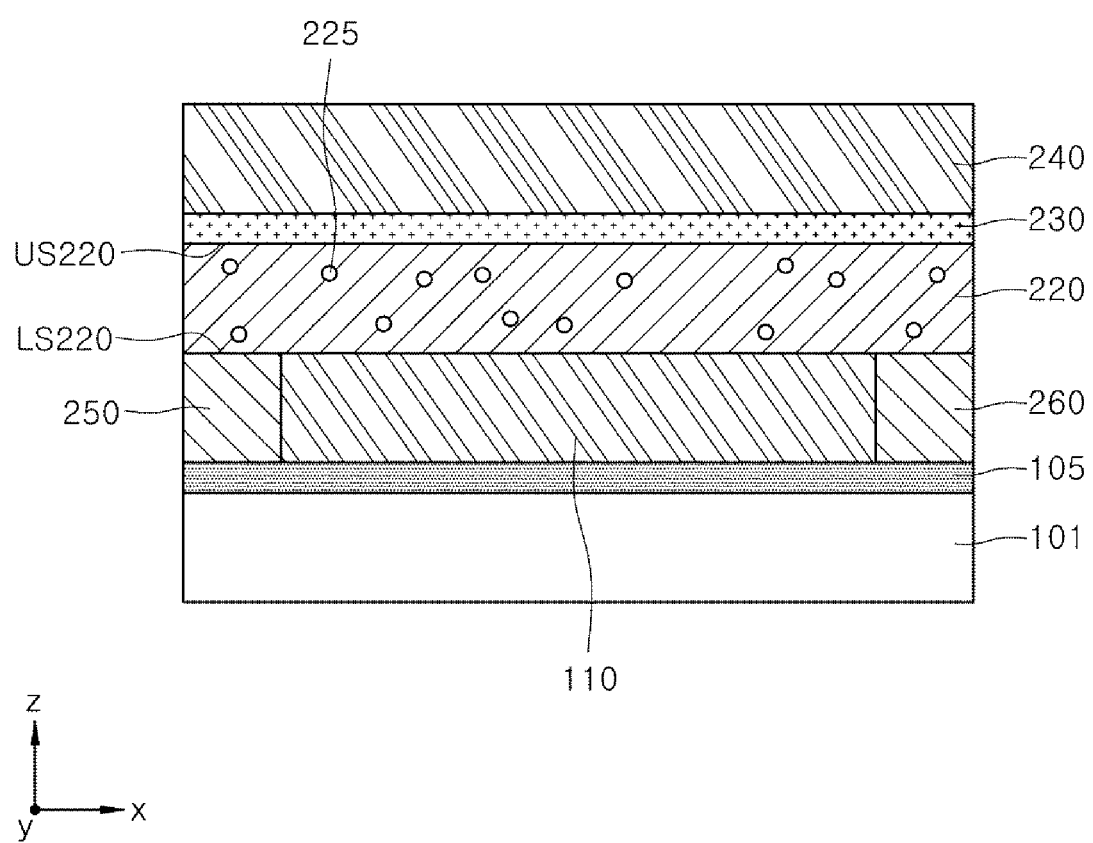
FIGS. 8 to 10 are views explaining a set operation of a nonvolatile memory device according to an embodiment of the present disclosure.
Figure 9:
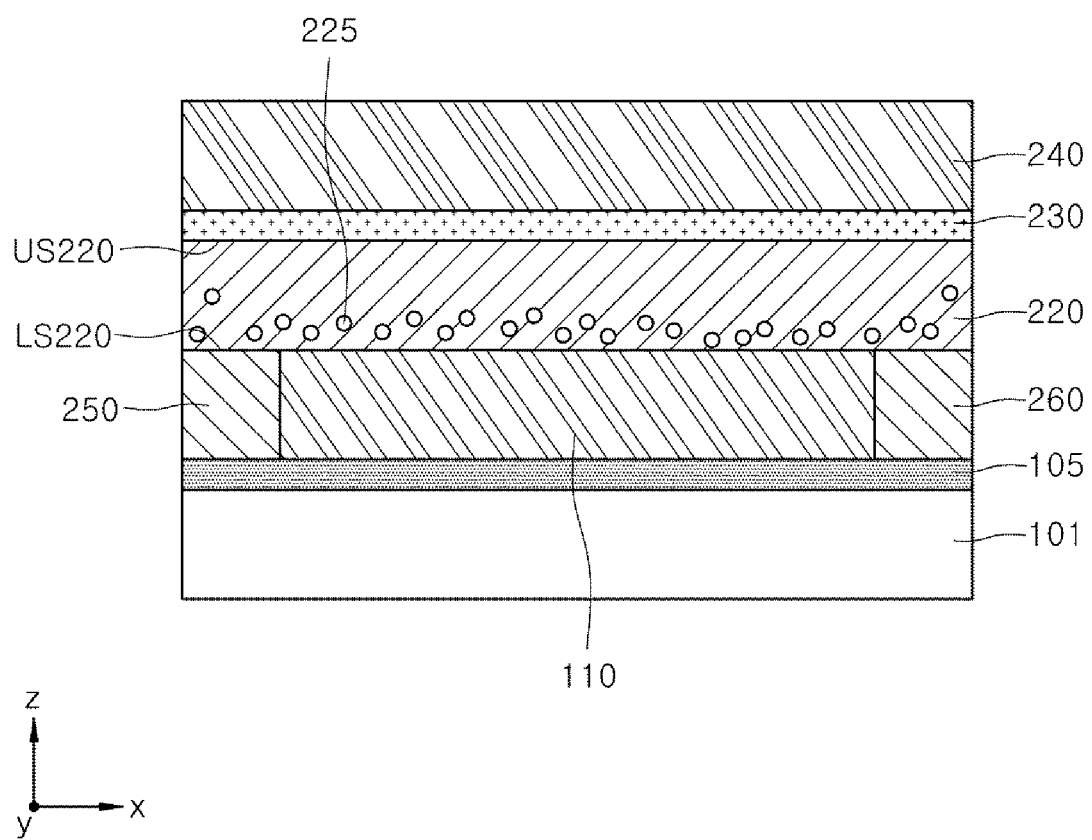
Figure 10:
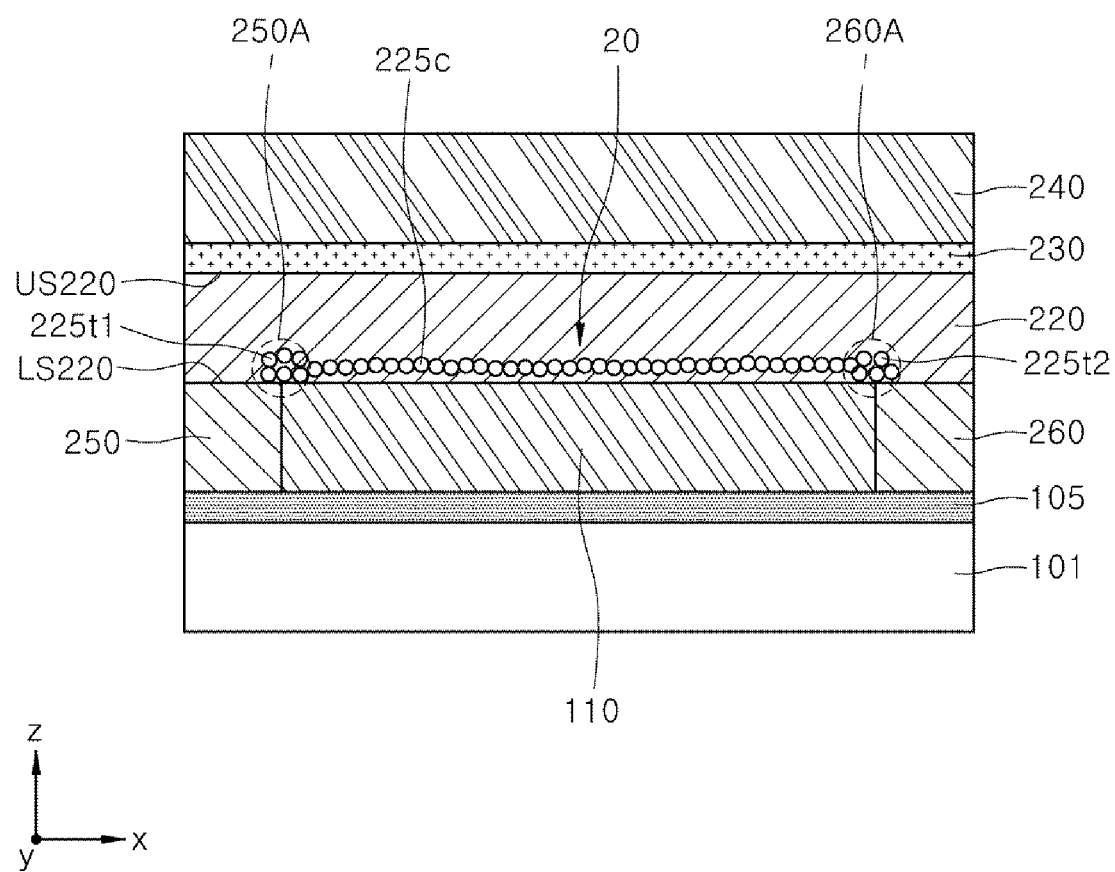
Figure 11:
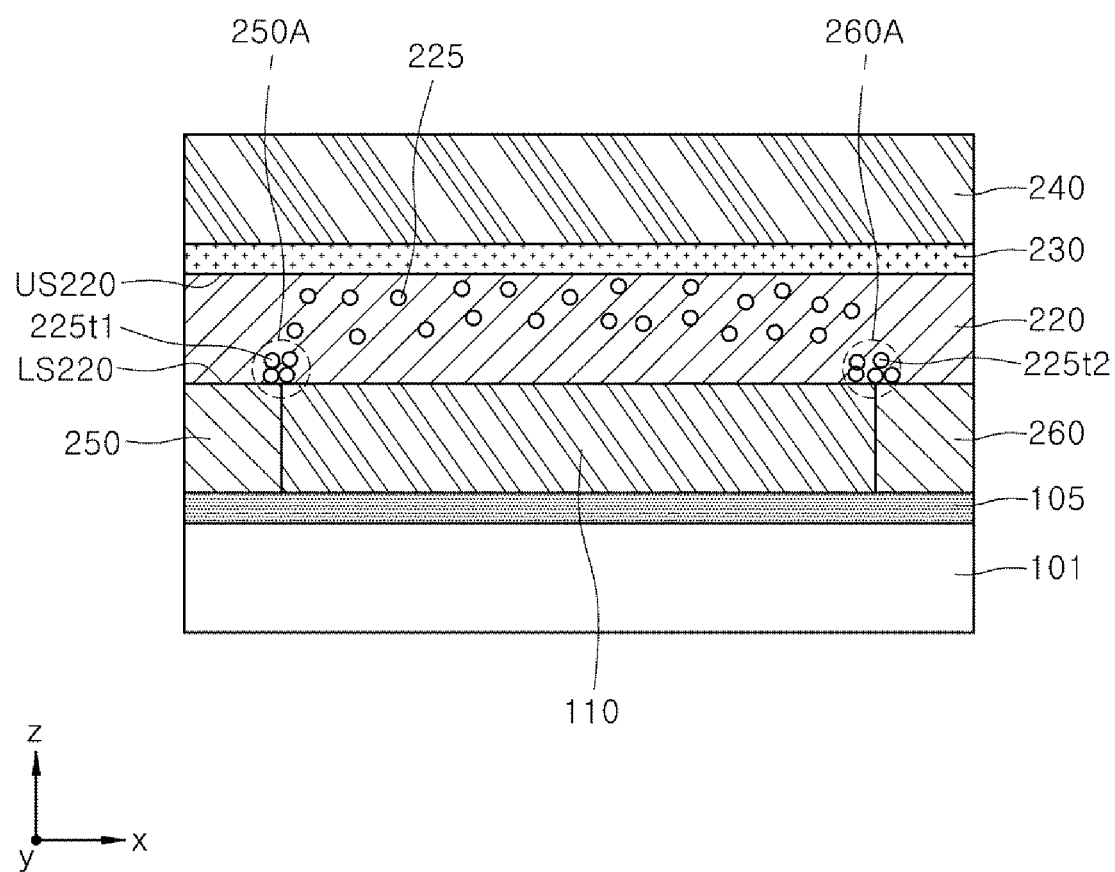
FIG. 11 is a view explaining a reset operation of a nonvolatile memory device according to an embodiment of the present disclosure.

Hereinafter, a method of operating the nonvolatile memory device 2 will be described with reference to FIGS. 8 to 11. FIGS. 8 to 10 are views explaining a set operation of the nonvolatile memory device 2 according to an embodiment of the present disclosure. FIG. 11 is a view explaining a reset operation of the nonvolatile memory device 2 according to an embodiment of the present disclosure.

Referring to FIG. 8, a nonvolatile memory device 2 described above in association with FIG. 7 may be provided. A resistance change layer 220 may have oxygen vacancies or movable metal ions 225. In an embodiment, the oxygen vacancies or movable metal ions 225 may be uniformly distributed inside the resistance change layer 220. Hereinafter, as an example, the resistance change layer 220 includes oxygen vacancies having a positive polarity. In another embodiment, substantially the same operation method may be applied when the resistance change layer 220 includes movable metal ions 125.

Referring to FIG. 9, a first gate voltage including a bias having a positive polarity may be applied to a gate electrode layer 240. By applying the first gate voltage, the oxygen vacancies 225 inside the resistance change layer 220 may move to a filament formation region adjacent to the first surface LS220. The filament formation region may refer to an inner region of the resistance change layer 220 adjacent to the interlayer insulation layer 110 and to the first and second gate electrode pattern layers 250 and 260.

According to an embodiment, the concentration or magnitude of the oxygen vacancies 225 moving to the filament formation region may be controlled by controlling the magnitude of the first gate voltage. The concentration of the oxygen vacancies 225 may determine the diameter of the conductive filament formed in the operation described below.

Referring to FIG. 10, while applying the first gate voltage to the gate electrode layer 240, a set voltage may be applied between the first electrode pattern layer 250 and the second electrode pattern layer 260. As a result, a conductive filament 20 electrically connecting the first electrode pattern layer 250 and the second electrode pattern layer 260 may be formed in the resistance change layer 220.

In an embodiment, when the set voltage is applied, an electric field may be concentrated on pattern edge portions 250A and 250B of the first and second electrode pattern layers 250 and 260, so that first and second trigger filaments 225t1 and 225t2 may be formed in the filament formation region of the resistance change layer 220 adjacent to the pattern edge portions 250A and 260A. The first and second trigger filaments 225t1 and 225t2 may be formed to contact the first and second electrode pattern layers 250 and 260. In addition, connecting filaments 225c may be respectively grown from the first and second trigger filaments 225t1 and 225t2 and combined with each other, thereby completing a continuous and connected conductive filament 20. By forming the conductive filament 20, the electrical resistance of the resistance change layer 220 can be decreased. The conductive filament 20 remains even after the first gate voltage and the set voltage are removed, so that the internal resistance state of the resistance change layer 120 can be written and maintained in a low resistance state.

The method of forming the conductive filament 20, and the conductive filament 20 formed thereby, may be substantially the same as the method of forming the conductive filament 10, and the conductive filament 10 formed thereby, described above with reference to FIGS. 2 to 4.

Meanwhile, a reset operation according to another embodiment of the present disclosure will be described with reference to FIG. 11. A second gate voltage with a bias having a negative polarity may be applied to the gate electrode layer 240. While applying the second gate voltage, a reset voltage may be applied between the first electrode pattern layer 250 and the second electrode pattern layer 260. The reset voltage may have different polarity from the set voltage of the set operation described above with reference to FIG. 10.

According to an embodiment, the oxygen vacancies 225 of the conductive filament 20 in the resistance change layer 220 may be decomposed by the energy provided by the reset voltage. As an example, the energy may be electrical energy or thermal energy generated by the electrical energy. In addition, the oxygen vacancies 225 made available from the decomposition may be expelled from the filament formation region by the second gate voltage. As the oxygen vacancies 225 are decomposed, at least a portion of the conductive filament 20 may be disconnected. As a result, the electrical resistance of the resistance change layer 220 may be increased. Accordingly, the internal resistance state of the resistance change layer 220 may be converted from a low resistance state to a high resistance state when the conductive filament is disconnected. The disconnection state of the conductive filament 20 is written and maintained even after the second gate voltage and the reset voltage are removed, so that the resistance change layer 220 can retain the high resistance state.

Figure 12:
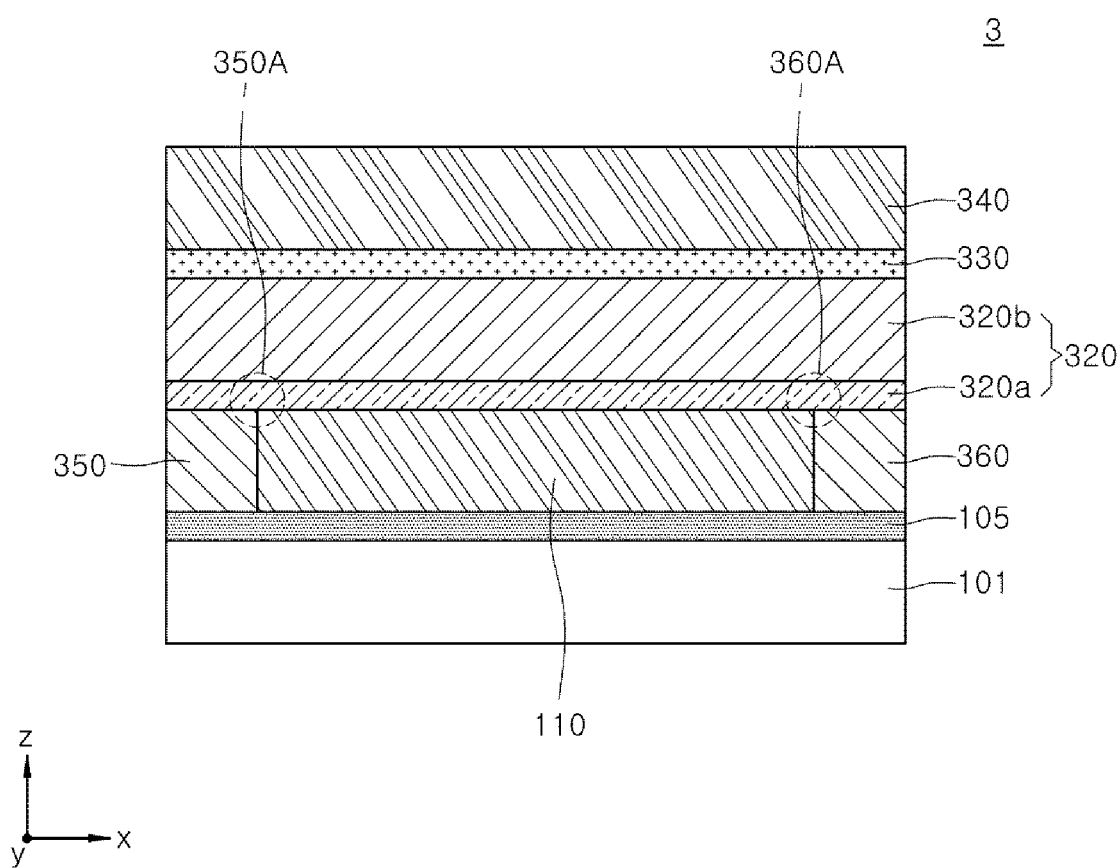
FIG. 12 is a cross-sectional view schematically illustrating a nonvolatile memory device according to another embodiment of the present disclosure.

FIG. 12 is a cross-sectional view schematically illustrating a nonvolatile memory device according to another embodiment of the present disclosure. Referring to FIG. 12, a nonvolatile memory device 3 may include a substrate 101, a resistance change layer 320 disposed over the substrate 101, a gate insulation layer 330 disposed on the resistance change layer 320, a gate electrode layer 340 disposed on the gate insulation layer 330, and a first electrode pattern layer 350 and a second electrode pattern layer 360 that are respectively disposed over the substrate 101 and disposed to contact different portions of the resistance change layer 320. In addition, the nonvolatile memory device 3 may further include a device insulation layer 105 to electrically insulate the first and second electrode pattern layers 350 and 360 from the substrate 101. In addition, the nonvolatile memory device 3 may further include an interlayer insulation layer 110 disposed between the first electrode pattern layer 350 and the second electrode pattern layer 360 on the device insulation layer 105.

The nonvolatile memory device 3 may have substantially the same configuration as the nonvolatile memory device 2 described above with reference to FIG. 7, except for the resistance change layer 320. That is, the configurations of the gate insulation layer 330, the gate electrode layer 340, the first electrode pattern layer 350 and the second electrode pattern layer 360 may be substantially the same those of the gate insulation layer 230, the gate electrode layer 240, the first electrode pattern layer 250 and the second electrode pattern layer 260 described above with reference to FIG. 7

In an embodiment, the resistance change layer 320 may include first and second resistive material layers 320a and 320b sequentially disposed on the first and second electrode pattern layers 350 and 360 and on the interlayer insulation layer 110. The first resistive material layer 320a may contact the first and second electrode pattern layers 350 and 360 and the interlayer insulation layer 110, and the second resistive material layer 320b may contact the gate insulation layer 330.

The first and second resistive material layers 320a and 320b may each include a variable resistance material. The variable resistance material may include oxygen vacancies or movable metal ions. The metal ion may be a cation or an anion. The variable resistance material may be substantially the same as the variable resistance material constituting the resistance change layer 120 of the nonvolatile memory device 1 described above with reference FIG. 1.

The first and second resistive material layers 320a and 320b may include different variable resistive materials, respectively. The first resistive material layer 320a may have a lower concentration of oxygen vacancies or a lower concentration of movable metal ions than the second resistive material layer 320b. The first resistive material layer 320a may be a higher resistance body than the second resistive material layer 320b. Also, the first resistive material layer 320a may be thinner and have a thickness less than that of the second resistive material layer 320b.

Figure 13:
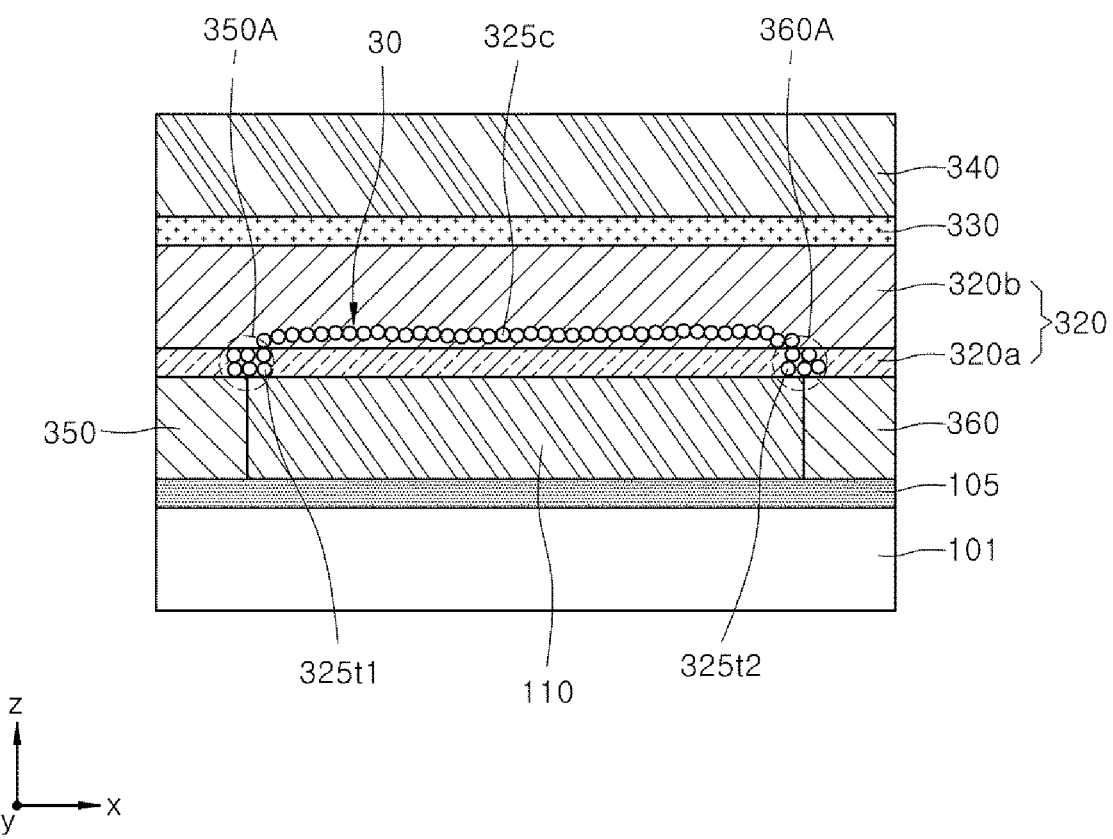
FIGS. 13 and 14 are views explaining a set operation and a reset operation, respectively, of a nonvolatile memory device according to an embodiment of the present disclosure.
Figure 14:
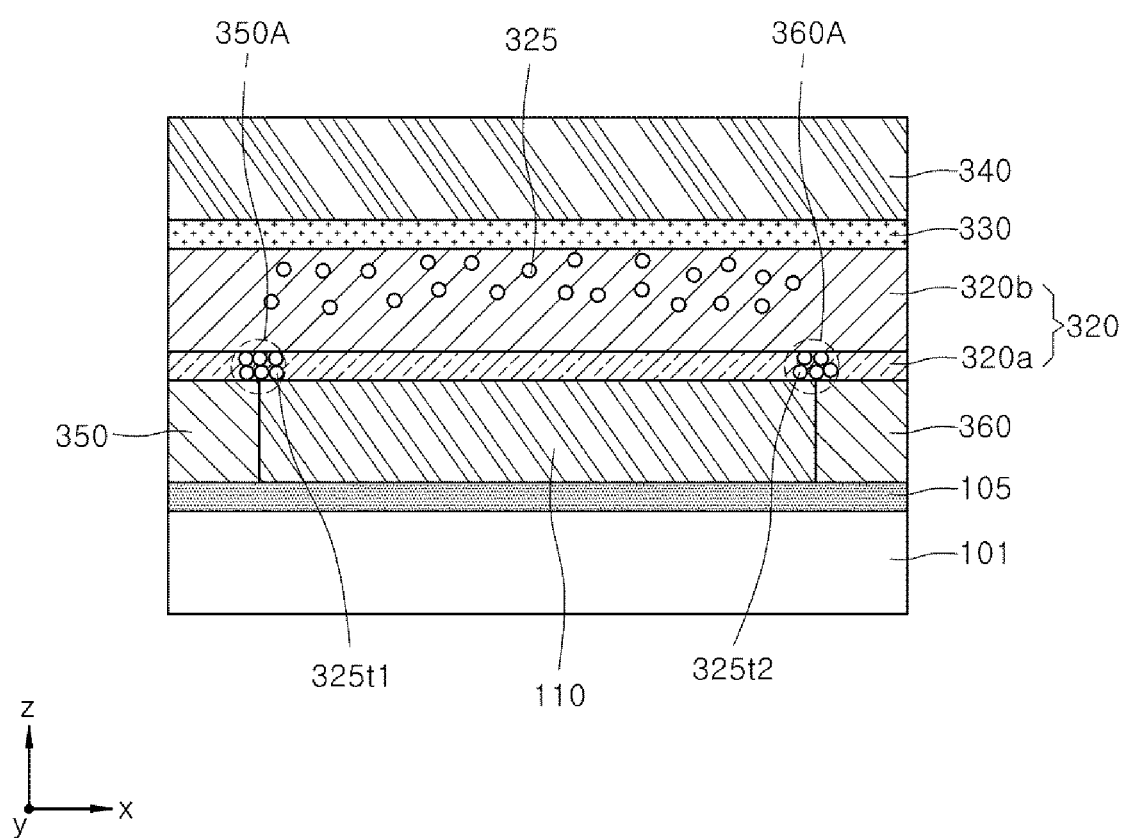

FIGS. 13 and 14 are views explaining a set operation and a reset operation of a nonvolatile memory device 3 according to an embodiment of the present disclosure. For convenience of description, an example is used implementing a resistance change layer 320 provided with oxygen vacancies 325 having a positive charge, but embodiments are not limited thereto. In other embodiments, for example, the resistance change layer 320 includes movable metal ions 325 and can be used in substantially the same way as will be described below.

Referring to FIG. 13, in the set operation, a first gate voltage including a bias having a positive polarity may be applied to the gate electrode layer 340. In addition, while applying the first gate voltage to the gate electrode layer 340, a set voltage may be applied between the first electrode pattern layer 350 and the second electrode pattern layer 360. Accordingly, an electric field due to the set voltage may be formed inside the resistance change layer 320.

Here, the electric field generated by the set voltage may be concentrated on the pattern edge portions 350A and 360A of the first and second electrode pattern layers 350 and 360. In addition, because the first resistive material layer 320a is a higher resistance body than the second resistive material layer 320b, when the set voltage is applied across the first resistive material layer 320a and the second resistive material layer 320b, a relatively larger voltage may be applied to the first resistive material layer 320a. As a result, first and second trigger filaments 325t1 and 325t2 may be formed in the first resistive material layer 320a adjacent to the pattern edge portions 350A and 360A, respectively.

The first and second trigger filaments 325t1 and 325t2 may be formed to contact the first and second electrode pattern layers 350 and 360. In addition, a connecting filament 325c connected to the first and second trigger filaments 325t1 and 325t2 may be formed in the second resistive material layer 320b. The connecting filament 325c may connect the first and second trigger filaments 325t1 and 325t2 to form a continuous, connected conductive filament 30.

Referring to FIG. 14, a second gate voltage including a bias having a negative polarity may be applied to the gate electrode layer 340. In addition, while applying the second gate voltage, a reset voltage may be applied between the first electrode pattern layer 350 and the second electrode pattern layer 360. The reset voltage may have a polarity different from that of the set voltage.

According to an embodiment, the oxygen vacancies 325 of the conductive filament 30 in the resistance change layer 320 may be decomposed by the Joule heat generated by the reset voltage. The decomposition of the oxygen vacancies 325 from conductive filament 30 may occur at a relatively high frequency in the connecting filament 325c of the second resistive material layer 320b. In addition, the decomposed oxygen vacancies 325 may be expelled and move away from the filament formation region as a result of the applied second gate voltage. As the oxygen vacancies 325 are decomposed, at least a portion of the conductive filament 30 may be disconnected. As a result, the electrical resistance of the resistance change layer 320 may be increased. Accordingly, the internal resistance state of the resistance change layer 320 may be converted from a low resistance state to a high resistance state.

Figure 15:
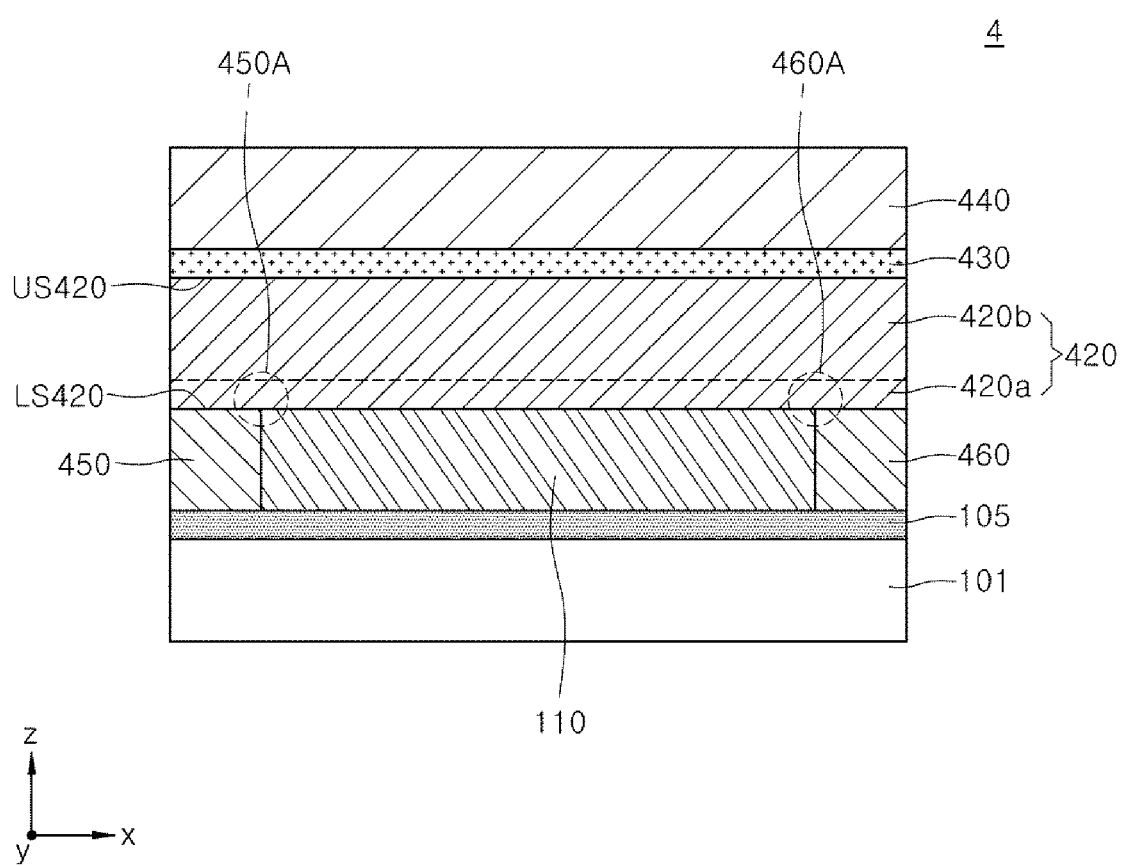
FIG. 15 is a cross-sectional view schematically illustrating a nonvolatile memory device according to another embodiment of the present disclosure.

FIG. 15 is a cross-sectional view schematically illustrating a nonvolatile memory device according to another embodiment of the present disclosure. Referring to FIG. 15, a nonvolatile memory device 4 may include a substrate 101, a resistance change layer 420 disposed over the substrate 101, a gate insulation layer 430 disposed on the resistance change layer 420, a gate electrode layer 440 disposed on the gate insulation layer 430, and a first electrode pattern layer 450 and a second electrode pattern layer 460 that are disposed respectively over the substrate 101 to contact different portions of the resistance change layer 420. In addition, the nonvolatile memory device 4 may further include a device insulation layer 105 for electrically insulating the first and second electrode pattern layers 450 and 460 from the substrate 101. In addition, the nonvolatile memory device 4 may further include an interlayer insulation layer 110 disposed between the first electrode pattern layer 450 and the second electrode pattern layer 460 on the device insulation layer 105.

The nonvolatile memory device 4 may have substantially the same configuration as the nonvolatile memory device 3 described above with reference to FIG. 12, except for the resistance change layer 420. That is, the configurations of the gate insulation layer 430, the gate electrode layer 440, the first electrode pattern layer 450 and the second electrode pattern layer 460 may be substantially the same those of the gate insulation layer 330, the gate electrode layer 340, the first electrode pattern layer 350 and the second electrode pattern layer 360 described above with reference to FIG. 12.

In an embodiment, the resistance change layer 420 may include first and second resistive material layers 420a and 420b sequentially disposed on the first and second electrode pattern layers 450 and 460 and on the interlayer insulation layer 110. The first resistive material layer 420a may contact the first and second electrode pattern layers 450 and 460 and the interlayer insulation layer 110, and the second resistive material layer 420b may contact the gate insulation layer 430.

The first and second resistive material layers 420a and 420b may each include a variable resistance material. The variable resistance material may include oxygen vacancies or movable metal ions 425. The metal ion may be a cation or an anion. The variable resistance material may be substantially the same as the variable resistance material constituting the resistance change layer 120 of the nonvolatile memory device 1 described above with reference FIG. 1.

In the embodiment, each of the first and second resistive material layers 420a and 420b may include the same variable resistive material. Here, the first resistive material layer 420a may have a lower concentration of oxygen vacancies 425 or a lower concentration of movable metal ions 425 than the second resistive material layer 420b. Accordingly, the first resistive material layer 420a may be a higher resistance body than the second resistive material layer 420b. Also, the first resistive material layer 420a may be thinner and have a thickness less than that of the second resistive material layer 420b.

In a manufacturing method according to an embodiment, the first and second resistive material layers 420a and 420b may be formed on the first and second electrode pattern layers 450 and 460 and on the interlayer insulation layer 110 using the same source material. Here, the first resistive material layer 420a including an oxide having a high concentration of oxygen vacancies 425 can be formed by providing a relatively low concentration of oxygen in the manufacturing process. Subsequently, a second resistive material layer 420b including an oxide having a relatively low concentration of oxygen vacancies 425 may be formed by increasing the concentration of the injected oxygen during the manufacturing process. In some embodiments, oxygen vacancies 425 inside the first and second resistive material layers 420a and 420b may be formed to have a concentration gradient. That is, the concentration of the oxygen vacancies 425 of the first resistive material layer 420a and the second resistive material layer 420b may be increased from the lower surface LS420 of the first resistive material layer 420a to the upper surface US420 of the second resistive material layer 420b.

In a manufacturing method according to another embodiment, the first and second resistive material layer 420a and 420b may be formed on the first and second electrode pattern layers 450 and 460 and on the interlayer insulation layer 110 using the same source material. Here, a relatively low concentration of movable metal ions 425 may be implanted to form the first resistive material layer 420a. Subsequentially, the concentration of the movable metal ions 425 to be implanted may be increased to form the second resistive material layer 420b. In some embodiments, the movable metal ions 425 inside the first and second resistive material layers 420a and 420b may be formed to have a concentration gradient. That is, the concentration of the movable metal ions 425 distributed inside the first resistive material layer 420a and the second resistive material layer 420b may be increased from the lower surface LS420 of the first resistive material layer 420a to the upper surface US420 of the second resistive material layer 420b.

Figure 16:
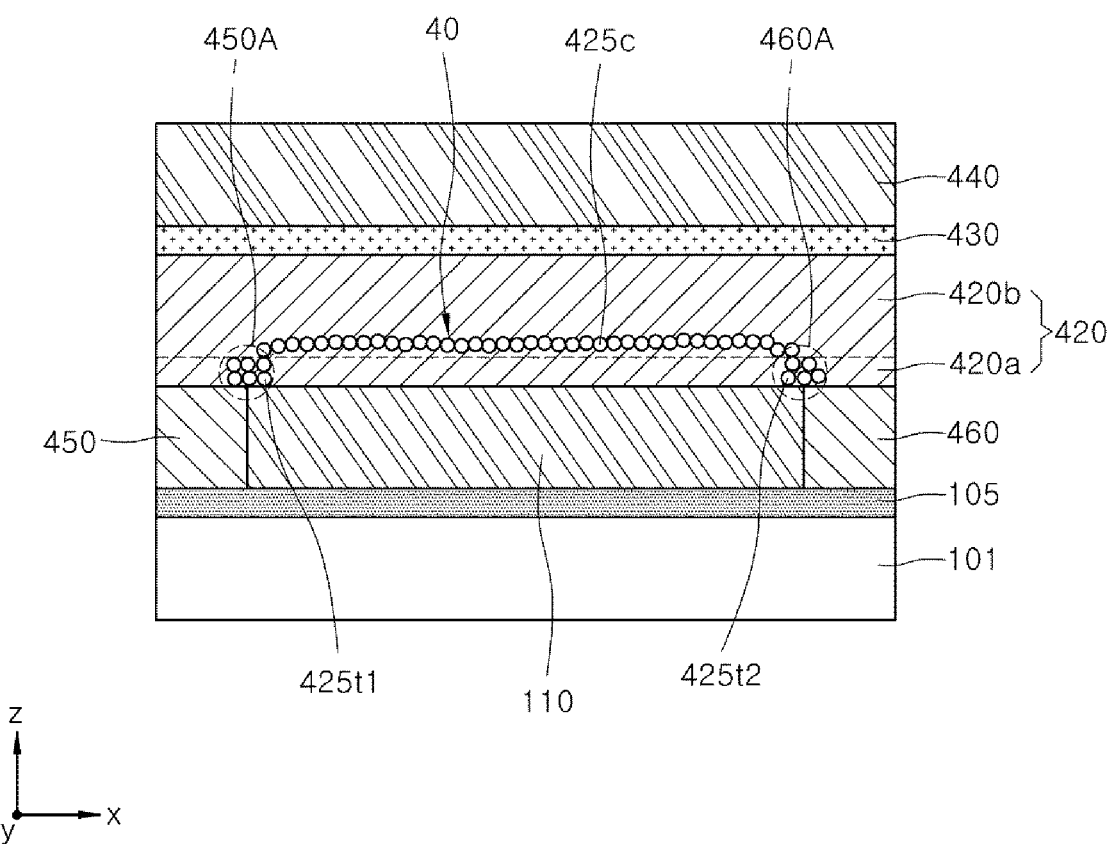
FIGS. 16 and 17 are views explaining a set operation and a reset operation, respectively, of a nonvolatile memory device according to an embodiment of the present disclosure.
Figure 17:
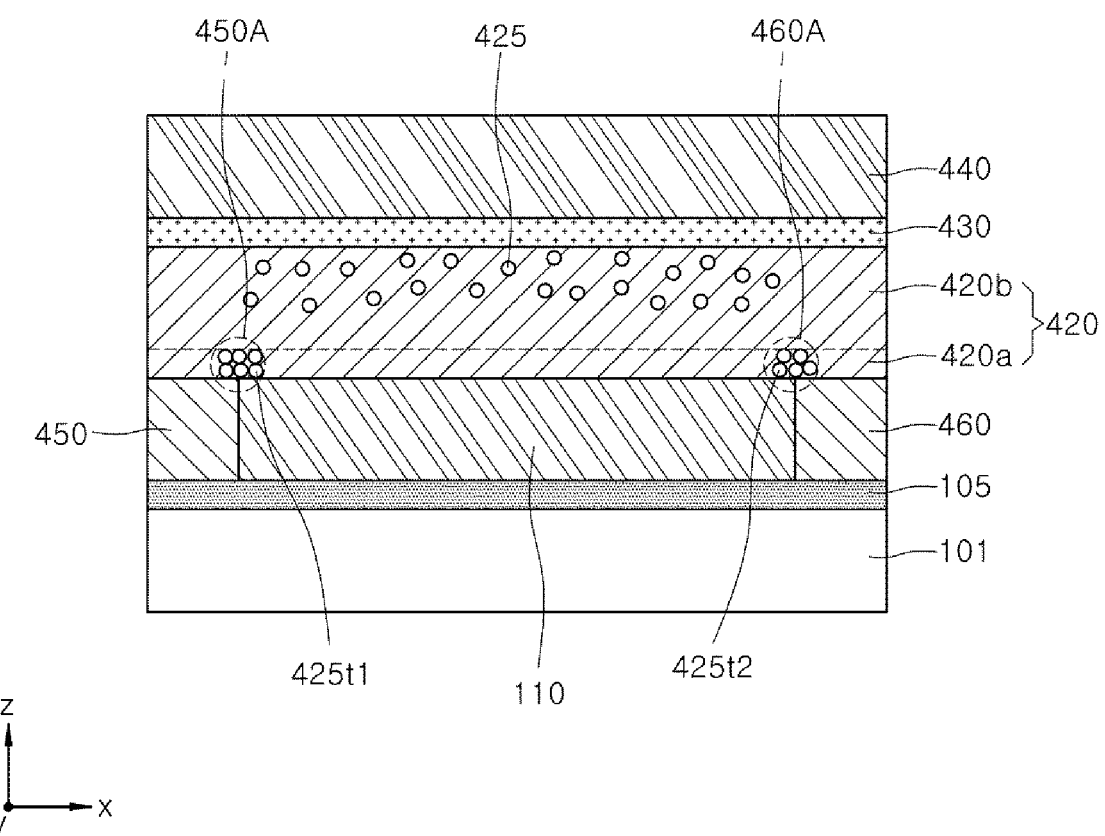

FIGS. 16 and 17 are views explaining a set operation and a reset operation of a nonvolatile memory device 4 according to an embodiment of the present disclosure. For convenience of description, an example is used with the resistance change layer 420 provided with oxygen vacancies 425 having a positive charge will be described as an embodiment, but embodiments are not limited thereto. In other embodiments, for example, the resistance change layer 420 that includes movable metal ions 425 can be used in substantially the same way.

Referring to FIG. 16, in the set operation, a first gate voltage including a bias having a positive polarity may be applied to the gate electrode layer 440. In addition, while applying the first gate voltage to the gate electrode layer 440, a set voltage may be applied between the first electrode pattern layer 450 and the second electrode pattern layer 460.

Here, electric field generated by the set voltage may be concentrated on the pattern edge portions 450A and 460A of the first and second electrode pattern layers 450 and 460, respectively. In addition, because the first resistive material layer 420a is a higher resistance body than the second resistive material layer 420b, when the set voltage is applied across the first resistive material layer 420a and the second resistive material layer 420b, a relatively higher voltage may be applied to the first resistive material layer 420a. As a result, first and second trigger filaments 425t1 and 425t2 may be formed in the first resistive material layer 420a adjacent to the pattern edge portions 450A and 460A, respectively.

Subsequently, a connecting filament 425c connected to the first and second trigger filaments 425t1 and 425t2 may be formed in the second resistive material layer 420b. The connecting filament 425c connects the first and second trigger filaments 425t1 and 425t2, thereby completing a continuous, connected conductive filament 40.

Referring to FIG. 17, a second gate voltage having a bias having a negative polarity may be applied to the gate electrode layer 440. In addition, while applying the second gate voltage, a reset voltage may be applied between the first electrode pattern layer 450 and the second electrode pattern layer 460. The reset voltage may have a different polarity from the set voltage.

According to an embodiment, the oxygen vacancies 425 of the conductive filament 40 in the resistance change layer 420 may be decomposed by the Joule heat generated by the reset voltage. The decomposition of the oxygen vacancies 425 from conductive filament 40 may occur at a relatively high frequency in the connecting filament 425c of the second resistive material layer 420b. In addition, the decomposed oxygen vacancies 425 may be expelled and move away from the filament formation region by applying the second gate voltage. As the oxygen vacancies 425 are decomposed, at least a portion of the conductive filament 40 may be disconnected. As a result, the electrical resistance of the resistance change layer 420 may be increased. Accordingly, the internal resistance state of the resistance change layer 420 may be converted from a low resistance state to a high resistance state and stored in a memory cell.

In other embodiments, the structures of the resistance change layer 320 described above with reference to FIG. 12 and the resistance change layer 420 described above with reference to FIG. 15 may be applied to the resistance change layer 120 described above with reference to FIG. 1. That is, the resistance change layer 120 may have a first resistive material layer in contact with the first and second electrode pattern layers 150 and 160 and the gate insulation layer 130 and a second resistive material layer disposed on the first resistive material layer. The first resistive material layer may be a higher resistance body as compared to the second resistive material layer. Accordingly, a trigger filament may be formed in the first resistive material layer, and a connecting filament may be formed in the second resistive material layer.

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A nonvolatile memory device comprising:
   a substrate;
   a resistance change layer disposed over the substrate;
   a gate insulation layer disposed on the resistance change layer;
   a gate electrode layer disposed on the gate insulation layer; and
   a first electrode pattern layer and a second electrode pattern layer that are disposed respectively over the substrate and disposed to contact different portions of the resistance change layer,
   wherein the resistance change layer comprises first and second resistive material layers that are sequentially disposed over the first and second electrode pattern layers, and
   wherein the first resistive material layer has a higher resistance than the second resistive material layer.

2. The nonvolatile memory device of claim 1, wherein the resistance change layer comprises oxygen vacancies or movable metal ions.

3. The nonvolatile memory device of claim 1, further comprising a conductive filament, formed in the resistance change layer when a set voltage is applied, to electrically connect the first and second electrode pattern layers.

4. The nonvolatile memory device of claim 3, wherein the conductive filament comprises first and second trigger filaments adjacent to respective edge portions of the first and second electrode pattern layers, and a connecting filament connecting the first and second trigger filaments to each other.

5. The nonvolatile memory device of claim 1, wherein the resistance change layer has a first surface and a second surface opposite to the first surface, and
   wherein the gate insulation layer, and the first and second electrode pattern layers are disposed to contact the first surface.

6. The nonvolatile memory device of claim 1, wherein the resistance change layer has a first surface and a second surface opposite to the first surface,
  wherein the gate insulation layer is disposed to contact the first surface, and
  wherein the first and second electrode pattern layers are disposed to contact the second surface.

7. The nonvolatile memory device of claim 1,
  wherein the first resistive material layer has a lower concentration of oxygen vacancies or a lower concentration of movable metal ions than the second resistive material layer.

8. The nonvolatile memory device of claim 7, wherein each of the first resistive material layer and the second resistive material layer comprises substantially the same variable resistance material.

\* \* \* \* \*